(12) United States Patent
Chen et al.

(10) Patent No.: US 9,854,674 B1
(45) Date of Patent: Dec. 26, 2017

(54) FLEXIBLE PRINTED CIRCUIT AND PRINTED CIRCUIT BOARD SOLDERED STRUCTURE

(71) Applicant: LuxNet Corporation, Zhongli, Taoyuan County (TW)

(72) Inventors: Ho-I Chen, Zhongli (TW); Yi-Ching Chiu, Zhongli (TW); Bo-Wei Liu, Zhongli (TW); Hsing-Yen Lin, Zhongli (TW); Hua-Hsin Su, Zhongli (TW)

(73) Assignee: Luxnet Corporation, Zhongli, Taoyuan County (TW)

( * ) Notice: Subject to any disclaimer, the term of this patent is extended or adjusted under 35 U.S.C. 154(b) by 0 days.

(21) Appl. No.: 15/460,683

(22) Filed: Mar. 16, 2017

(30) Foreign Application Priority Data

Nov. 16, 2016 (TW) ................................ 10527483 U

(51) Int. Cl.
| | |
|---|---|
| *H05K 1/00* | (2006.01) |
| *H05K 1/14* | (2006.01) |
| *H01R 12/61* | (2011.01) |
| *H01R 4/02* | (2006.01) |
| *H05K 1/02* | (2006.01) |
| *H05K 1/11* | (2006.01) |

(52) U.S. Cl.
CPC ............... *H05K 1/141* (2013.01); *H01R 4/02* (2013.01); *H01R 12/61* (2013.01); *H05K 1/0245* (2013.01); *H05K 1/112* (2013.01); *H05K 2201/041* (2013.01); *H05K 2201/058* (2013.01)

(58) Field of Classification Search
USPC ................................. 361/749, 748, 751, 750
See application file for complete search history.

(56) References Cited

U.S. PATENT DOCUMENTS

| | | | |
|---|---|---|---|
| 7,688,594 B2 * | 3/2010 | Muto ................... | H05K 1/0219 174/254 |
| 2014/0176840 A1 * | 6/2014 | Hashido .............. | G02F 1/13306 349/33 |

\* cited by examiner

*Primary Examiner* — Andargie M Aychillhum
(74) *Attorney, Agent, or Firm* — Muncy, Geissler, Olds & Lowe, P.C.

(57) ABSTRACT

A flexible printed circuit and printed circuit board soldered structure is provided. The structure includes signal transmission lines which dispense with any through hole, thereby enhancing integrity of high-frequency signals. The special design of the signal line structure of the flexible printed circuit and the printed circuit board together provides a satisfactory high-frequency signal transmission interface and enables a soldering technique which is highly practicable and compatible with the flexible printed circuit and printed circuit board soldered structure.

12 Claims, 12 Drawing Sheets

FLEXIBLE PRINTED CIRCUIT AND PRINTED CIRCUIT BOARD SOLDERED STRUCTURE

BACKGROUND OF THE INVENTION

1. Technical Field

The present invention relates to flexible printed circuit and printed circuit board soldered structure and, more particularly, to a flexible printed circuit and printed circuit board soldered structure for use with high-frequency transmission technology.

2. Description of the Prior Art

In the field of optical communication, data transmission always has a trend toward high speeds. However, high-speed signal transmission is confronted with ever-changing issues. To perform high-speed signal transmission, it is necessary to take account of the integrity of high-frequency signals in the course of signal transmission. When designing a high-frequency circuit, it is necessary to give considerations to the measures taken to reduce signal attenuation with a view to ensuring the integration and matching of characteristic impedance. Therefore, impedance matching design must give considerations to not only adjustment of line width and line spacing but also through hole design. Therefore, persons skilled in the art are eager to solve a problem: how to redesign an appropriate high-frequency package framework which meets the demand for high-frequency circuits in high-speed networks.

The process of soldering a flexible printed circuit to a printed circuit board in the course of electronic product packaging usually requires via holes to be disposed at the end of the flexible printed circuit, so that the flexible printed circuit is connected to lower signal lines through the via holes to solder the lower signal lines to the printed circuit board signal lines from above, thereby effectuating electrical interconnects. However, under a high-frequency transmission framework, the via holes compromise the characteristics and integrity of high-frequency signals, thereby further reducing transmission efficiency.

SUMMARY OF THE INVENTION

It is an objective of the present invention to provide a flexible printed circuit and printed circuit board soldered structure which dispenses with the need to provide any through hole on signal lines, so as not to reduce high-frequency signal transmission efficiency.

To solve the foregoing problem, the present invention is to provide a flexible printed circuit and printed circuit board soldered structure, comprising a flexible printed circuit and a printed circuit board. The flexible printed circuit comprises a soft board body, with a first signal pad region disposed on a side of the soft board body, and a first grounding pad region disposed on an opposing side of the soft board body. The first signal pad region comprises a pair of first differential signal transmission lines and two first grounding soldering portions flanking the pair of the first differential signal transmission lines. The first differential signal transmission lines have intact surfaces dispensing with any through hole, wherein ends of the first differential signal transmission lines are flush with an edge of the soft board body. A through hole is disposed on the first grounding soldering portion to electrically connect the first grounding soldering portion and the first grounding pad region, an insulating region is disposed on the first grounding pad region and corresponding in position to the first differential signal transmission lines on a side of the soft board body, and the insulating region extends inward from an edge of the soft board body. The printed circuit board comprises a substrate body, a second signal pad region disposed on a side of the substrate body, and a second grounding pad region disposed on an opposing side of the substrate body. The second signal pad region comprises a pair of second differential signal transmission lines and two second grounding soldering portions flanking the pair of second differential signal transmission lines. The second differential signal transmission lines have intact surfaces dispensing with any through hole, with a through hole disposed on the second grounding soldering portions to electrically connect the second grounding soldering portions and the second grounding pad region. Therein, the flexible printed circuit is disposed on the printed circuit board, the insulating region of the first grounding pad region is disposed above the second differential signal transmission lines to stay away from the second differential signal transmission lines and thus preclude having a short cut with the second differential signal transmission lines, and the ends of the first differential signal transmission lines are soldered to the second differential signal transmission lines from above by a solder to effectuate electrical connection.

Further, a half hole is disposed at the ends of the first differential signal transmission lines to hold a solder.

Further, an end of the first grounding soldering portion is flush with an edge of the soft board body, and the end of the first grounding soldering portion is soldered to the second grounding soldering portions from above by a solder to effectuate electrical connection.

Further, a half hole is disposed at the end of the first grounding soldering portion to hold the solder.

Further, a level sign is disposed on the substrate body of the printed circuit board and beside the second differential signal transmission lines to serve as soldering reference.

Further, a distance between each said level sign and an end of a corresponding one of the second differential signal transmission lines is shorter than or equal to an extension distance by which the insulating region extends inward.

Another objective of the present invention is to provide a flexible printed circuit and printed circuit board soldered structure, comprising a flexible printed circuit and a printed circuit board. The flexible printed circuit comprises a soft board body, with a first signal pad region disposed on a side of the soft board body, and a first grounding pad region disposed on an opposing side of the soft board body. The first signal pad region comprises a first signal transmission line and two first grounding soldering portions flanking the first signal transmission line. The first signal transmission line has an intact surface dispensing with any through hole, wherein an end of the first signal transmission lines is flush with an edge of the soft board body. A through hole is disposed on the first grounding soldering portion to electrically connect the first grounding soldering portion and the first grounding pad region, and an insulating region is disposed on the first grounding pad region and corresponding in position to the first signal transmission line on a side of the soft board body, and the insulating region extends inward from an edge of the soft board body. The printed circuit board comprises a substrate body, a second signal pad region disposed on a side of the substrate body, and a second grounding pad region disposed on an opposing side of the substrate body. The second signal pad region comprises a second signal transmission line and two second grounding soldering portions flanking the second signal transmission line. The second signal transmission line has an intact surface dispensing with any through hole, with a through hole disposed on the second grounding soldering portions to electrically connect the second grounding soldering portions and the second grounding pad region. Therein, the flexible printed circuit is disposed on the printed circuit board, the insulating region of the first grounding pad region is disposed above the second signal transmission lines to stay away from the second signal transmission lines and thus preclude developing a short circuit together with the second signal transmission lines, and the end of the first signal transmission lines is soldered to the second signal transmission line from above by a solder to effectuate electrical connection.

Further, a half hole is disposed at the end of the first signal transmission lines to hold a solder.

Further, an end of the first grounding soldering portion is flush with an edge of the soft board body, and the end of the first grounding soldering portion is soldered to the second grounding soldering portions from above by a solder to effectuate electrical connection.

Further, a half hole is disposed at the end of the first grounding soldering portion to hold the solder.

Further, a level sign is disposed on the substrate body of the printed circuit board and beside the second signal transmission line to serve as soldering reference.

Further, a distance between the level sign and an end of the second signal transmission line is shorter than or equal to an extension distance by which the insulating region extends inward.

Therefore, the present invention has the following advantages over the prior art:

1. The flexible printed circuit and printed circuit board soldered structure of the present invention not only displays satisfactory high-frequency transmission characteristics, but also dispenses with the need to provide any through hole at the positions of the soldering of signal transmission lines, thereby enhancing the integrity of high-frequency signals during signal transmission.

2. The soldered structure of the present invention is so simple that it is almost the same as the soldering techniques disclosed in the prior art.

DETAILED DESCRIPTION OF THE INVENTION

The technical features and technical solutions of the present invention are hereunder described with reference to accompanying drawings. For illustrative sake, the accompanying drawings are not drawn to scale. The accompanying drawings and the scales thereof are not restrictive of the scope of the present invention.

Figure 1:
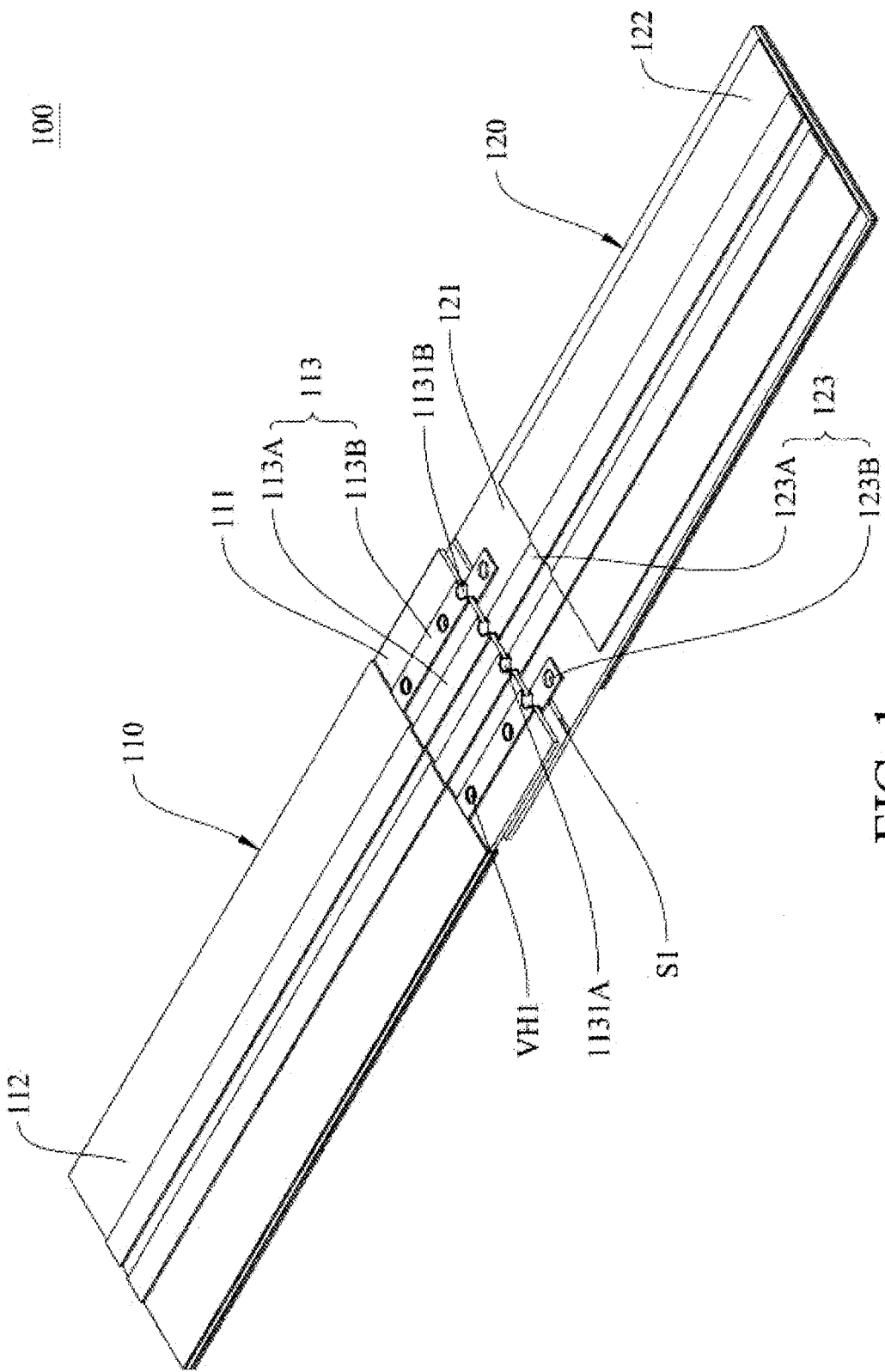
FIG. 1 is a perspective view of the first embodiment according to the present invention.
Figure 2:
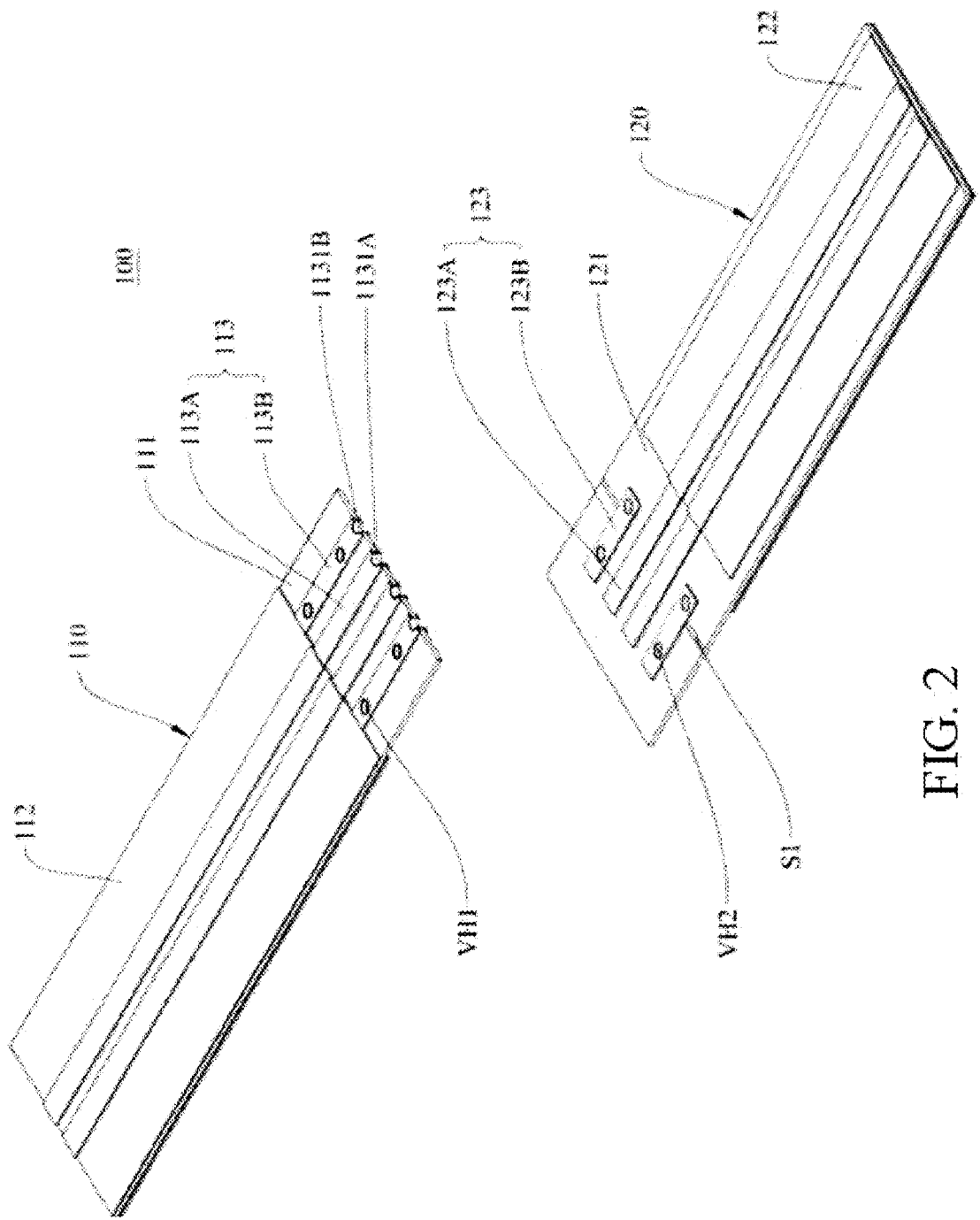
FIG. 2 is an exploded view (1) of the first embodiment according to the present invention.
Figure 3:
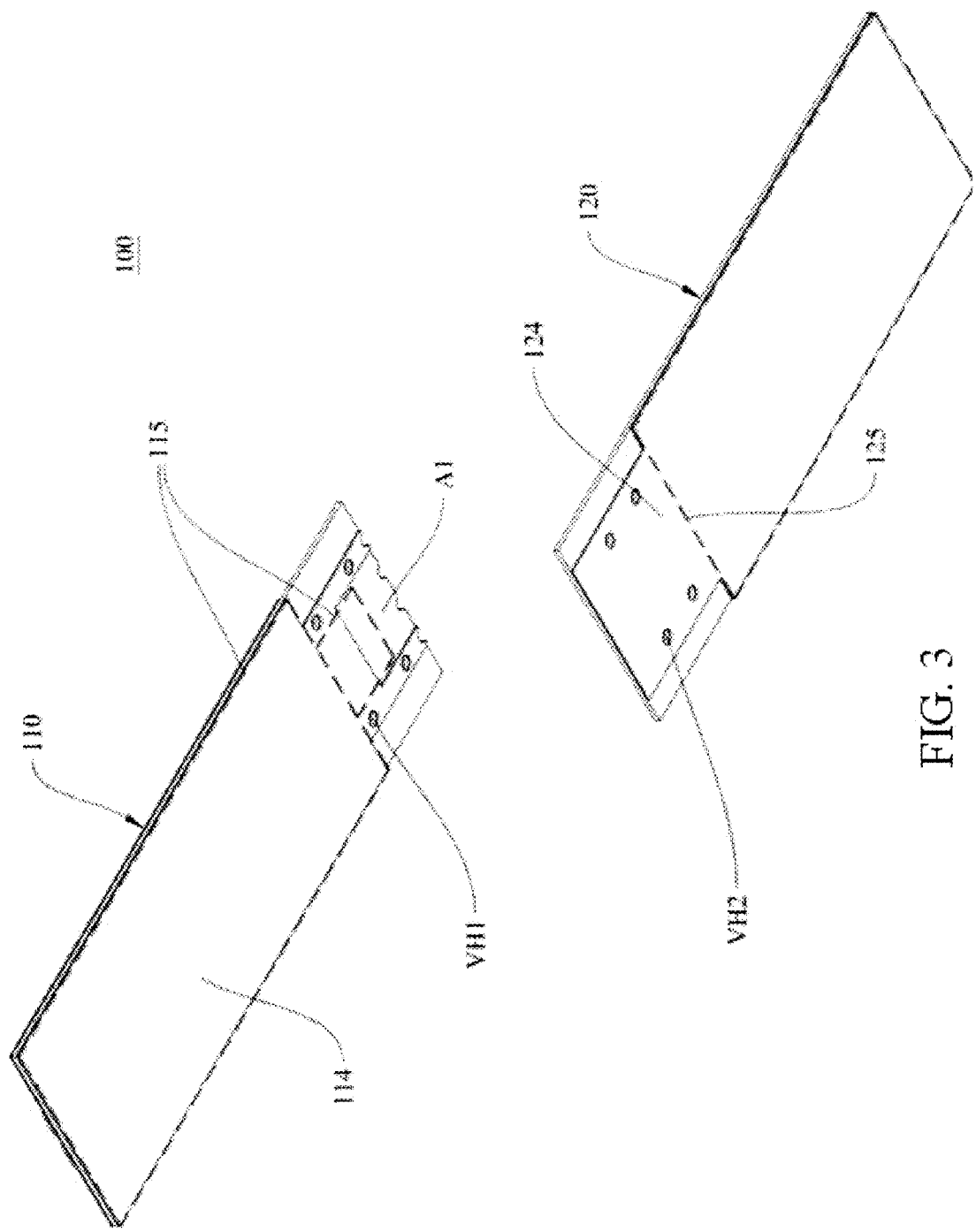
FIG. 3 is an exploded view (2) of the first embodiment according to the present invention.

FIG. 1, FIG. 2, and FIG. 3 are a perspective view, an exploded view (1), and an exploded view (2) of the first embodiment according to the present invention, respectively. The present invention is described below with reference to the aforesaid diagrams.

The present invention provides a flexible printed circuit and printed circuit board soldered structure 100 which comprises a flexible printed circuit 110 (FPC) and a printed circuit board 120 (PCB).

The flexible printed circuit 110 is tri-layered and comprises, from bottom to top a protective layer 115, a soft board body 111, and a protective layer 112 disposed above the soft board body 111. A first signal pad region 113 is disposed on one side of the soft board body 111. A first grounding pad region 114 is disposed on the opposing side of the soft board body 111. Both the first signal pad region 113 and the first grounding pad region 114 are conductive copper foils disposed on the soft board body 111 by wiring layout. Further, the first signal pad region 113 comprises a pair of first differential signal transmission lines 113A and two first grounding soldering portions 113B which flank the pair of first differential signal transmission lines 113A.

High-frequency signals passing through a through hole are likely to produce parasitic capacitance and thus compromise signal integrity and high-frequency characteristics while high-frequency signal transmission is taking place; hence, the first differential signal transmission lines 113A have intact surfaces which dispense with any through hole. Furthermore, the ends of the first differential signal transmission lines 113A are flush with the edge of the soft board body 111 so that the ends of the first differential signal transmission lines 113A can be soldered to second differential signal transmission lines 123A of the printed circuit board 120 below. In a preferred embodiment, a half hole 1131A for holding a solder is disposed at each of the ends of the first differential signal transmission lines 113A so that the ends of the first differential signal transmission lines 113A can be covered with a solder FA (as shown in FIG. 4) and thus soldered to the second differential signal transmission lines 123A of the printed circuit board 120 below.

Figure 4:
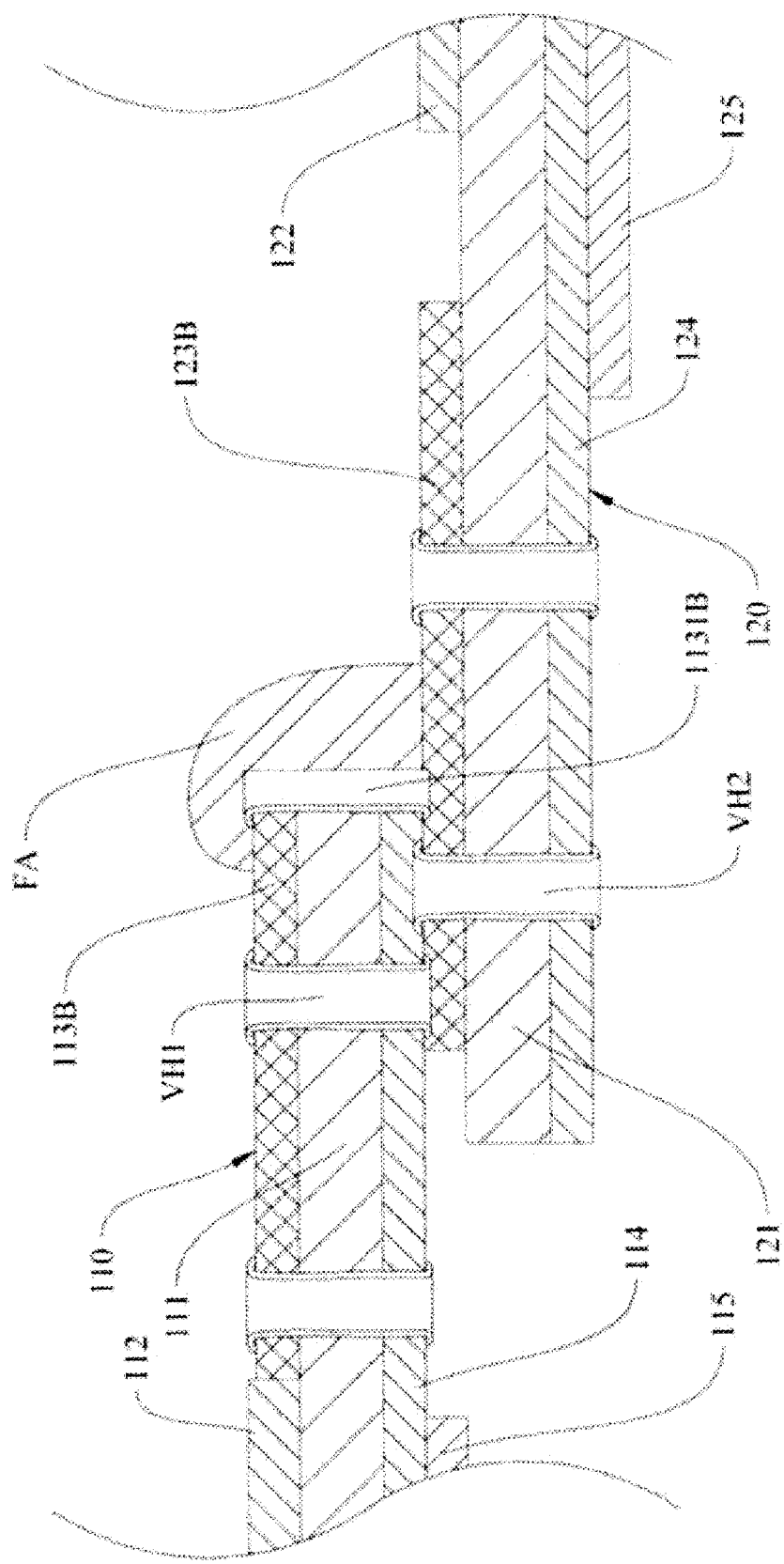
FIG. 4 is a cross-sectional view of the first embodiment according to the present invention.
Figure 5:
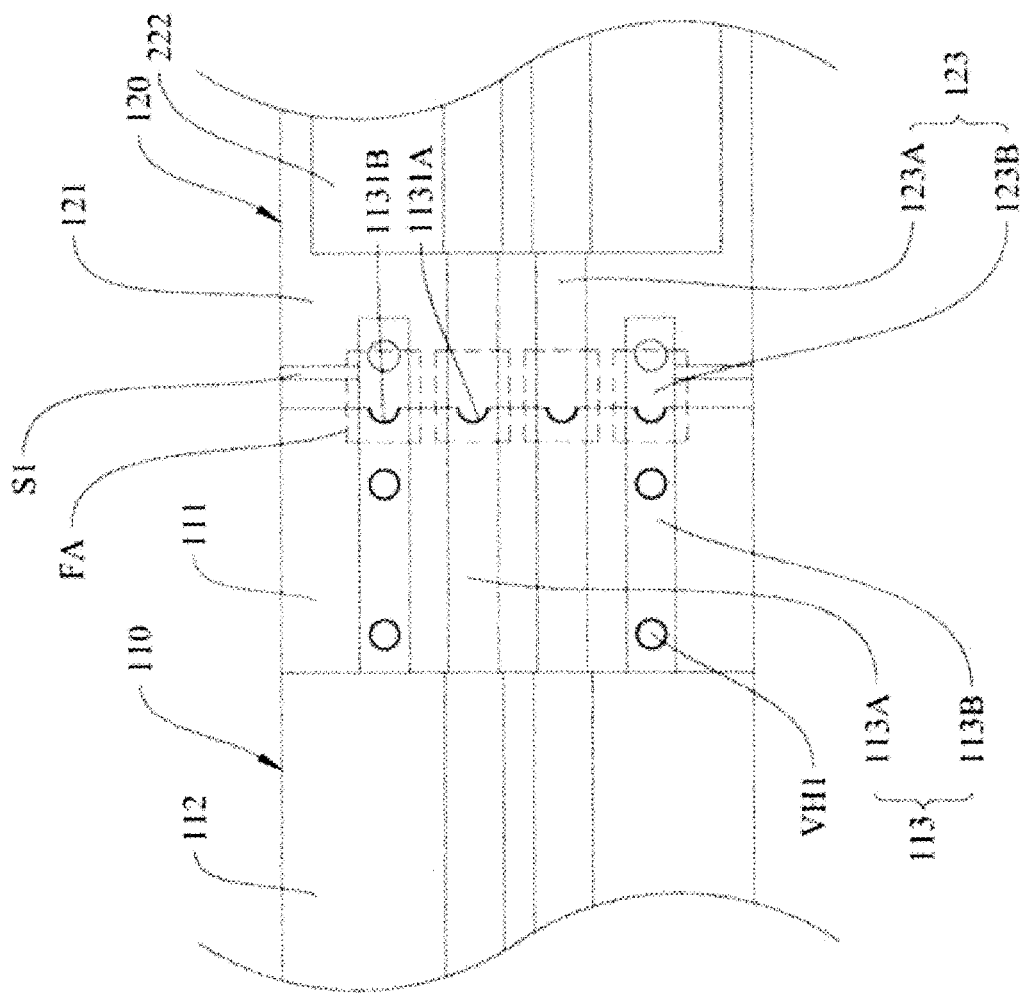
FIG. 5 is a top view of the first embodiment according to the present invention.

FIG. 4 and FIG. 5 are a cross-sectional view and a top view of the first embodiment according to the present invention, respectively. The present invention is described below with reference to the aforesaid diagrams.

A through hole VH1 is disposed on the first grounding soldering portion 113B to electrically connect the first grounding soldering portion 113B and the first grounding pad region 114. The edge of the first grounding soldering portion 113B and the edge of the soft board body 111 are flush with each other and thus can be soldered together from above the soft board body 111 and a second grounding soldering portion 123B of the printed circuit board 120 below. In a preferred embodiment, a half hole 1131B is disposed at the end of the first grounding soldering portion 113B to hold the solder FA; hence, the end of the first grounding soldering portion 113B is covered with the solder FA and thus can be soldered to the second grounding soldering portion 123B of the printed circuit board 120 below. The through hole VH1 and the half hole 1131B are of any shapes, such as round and square, and the present invention is not limited thereto. The half hole 1131A, 1131B are optional. In another preferred embodiment, the half hole 1131A, 1131B are dispensed with, and the solder is attached to the surface of a metal film to effectuate electrical interconnects. In another preferred embodiment, the first grounding soldering portions 113B flank and extend along the first differential signal transmission lines 113A and thus effectuate a grounded coplanar waveguide (GCPW) structure together with the first differential signal transmission lines 113A, but the present invention is not limited thereto.

An insulating region A1 is disposed on the first grounding pad region 114 and corresponds in position to the first differential signal transmission lines 113A on the soft board body 111. The insulating region A1 extends inward from an edge of the soft board body 111. The insulating region A1 is disposed right below the first differential signal transmission lines 113A so that the first grounding pad region 114 does not come into contact with the second differential signal transmission lines 123A on the printed circuit board 120 when the flexible printed circuit 110 is disposed on the printed circuit board 120, so as not to develop any short circuit. The insulating region A1 is a naked region (i.e., the soft board body 111 per se), which dispenses with any copper foil, formed as a result of inward extension of the first grounding pad region 114. In another preferred embodiment, the insulating region A1 is an insulating layer disposed on the first grounding pad region 114, but the present invention is not limited thereto. In another preferred embodiment, the protective layer 115 below the soft board body 111 extends and covers the first grounding pad region 114 from below so that only metal pads with the through holes VH1 are exposed from two sides of the first grounding pad region 114 to prevent the first grounding pad region 114 from coming into contact with the ends of the second differential signal transmission lines 123A, so as not to develop any short circuit.

Referring to FIG. 1, FIG. 2, and FIG. 3, the printed circuit board 120 is tri-layered and comprises, from bottom to top, a protective layer 125, a substrate body 121, and a protective layer 122 disposed above the substrate body 121. A second signal pad region 123 is disposed on one side of the substrate body 121. A second grounding pad region 124 is disposed on the opposing side of the substrate body 121. Both the second signal pad region 123 and the second grounding pad region 124 are conductive copper foils disposed on the substrate body 121 by wiring layout. The second signal pad region 123 comprises a pair of second differential signal transmission lines 123A and two second grounding soldering portions 123B which flank the pair of second differential signal transmission lines 123A.

To prevent through holes from compromising high-frequency characteristics of high-frequency signals, the surfaces of the second differential signal transmission lines 123A are intact and dispense with any through hole to maintain the integrity of high-frequency signals being transmitted along the second differential signal transmission lines 123A. The end of the printed circuit board 120 lacks the protective layer 122 so as to expose the second differential signal transmission lines 123A and the second grounding soldering portions 123B for use in soldering.

Referring to FIG. 4, a through hole VH2 is disposed on the second grounding soldering portions 123B to electrically connect the second grounding soldering portions 123B and the second grounding pad region 124. In another preferred embodiment, the second grounding soldering portions 123B flank and extend along the second differential signal transmission lines 123A and thus effectuate a grounded coplanar waveguide (GCPW) structure together with the second differential signal transmission lines 123A, but the present invention is not limited thereto. The through hole VH2 is of any shapes, such as round and square, and the present invention is not limited thereto.

Figure 6:
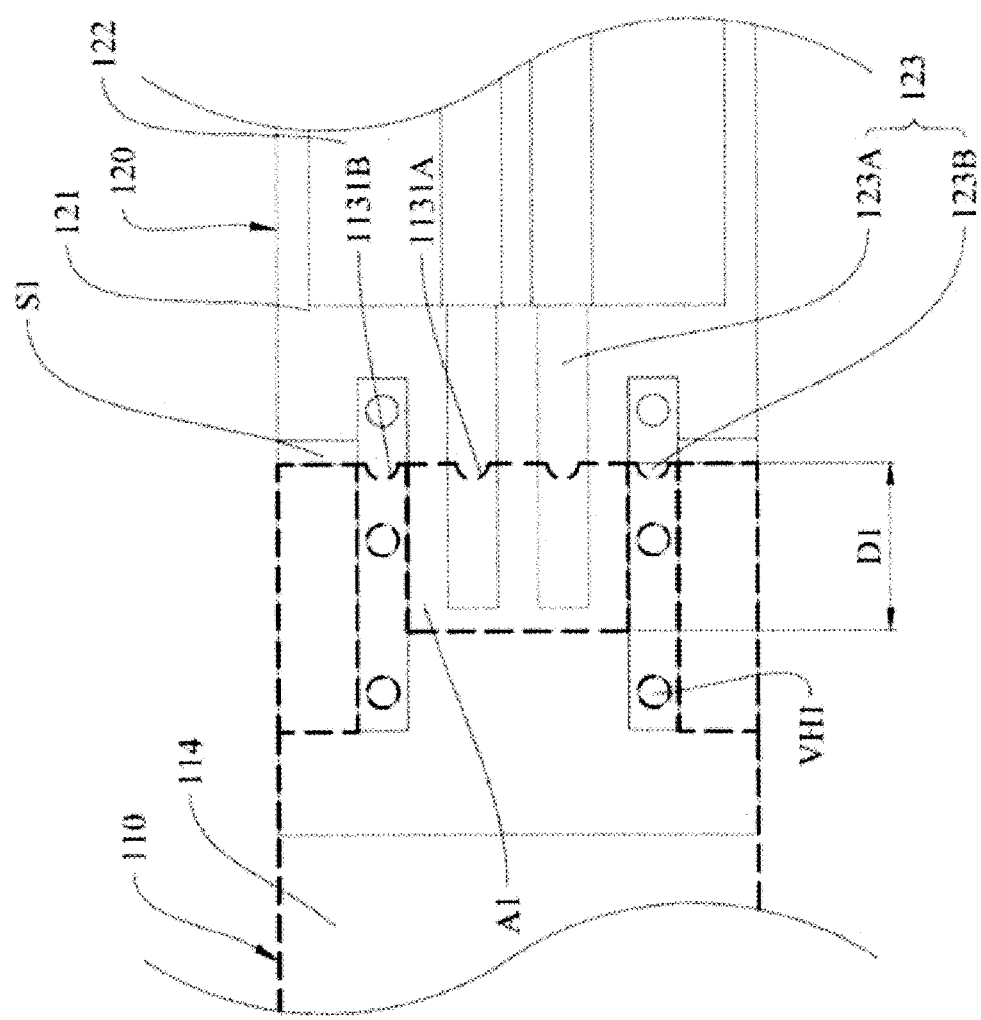
FIG. 6 is a partial transparent schematic view of the first embodiment according to the present invention.

FIG. 6 is a partial transparent schematic view of the flexible printed circuit and printed circuit board soldered structure of the present invention. The present invention is described below with reference to the aforesaid diagram.

The flexible printed circuit 110 is disposed on the printed circuit board 120. The insulating region A1 of the first grounding pad region 114 is disposed above the second differential signal transmission lines 123A to stay away from the second differential signal transmission lines 123A and thus preclude developing a short circuit together with the second differential signal transmission lines 123A. The ends of the first differential signal transmission lines 113A are soldered to the second differential signal transmission lines 123A by the solder FA to effectuate electrical connection.

To render it easy for assembly workers or automated machines to perform a soldering operation and reduce the likelihood soldering failures, a level sign S1 is disposed on the substrate body 121 of the printed circuit board 120 and beside the second differential signal transmission lines 123A to serve as reference for use in the soldering operation. The level signs S1 enable the assembly workers or automated machines to confirm the distance between the insulating region A1 below the flexible printed circuit 110 and the ends of the second differential signal transmission lines 123A. The distance between each level sign S1 and the end of a corresponding one of the second differential signal transmission lines 123A is preferably shorter than or equal to an extension distance D1 by which the insulating region A1 extends inward.

The second embodiment of the present invention is described below. The second embodiment differs from the first embodiment mainly in the quantity of the signal transmission lines.

Figure 7:
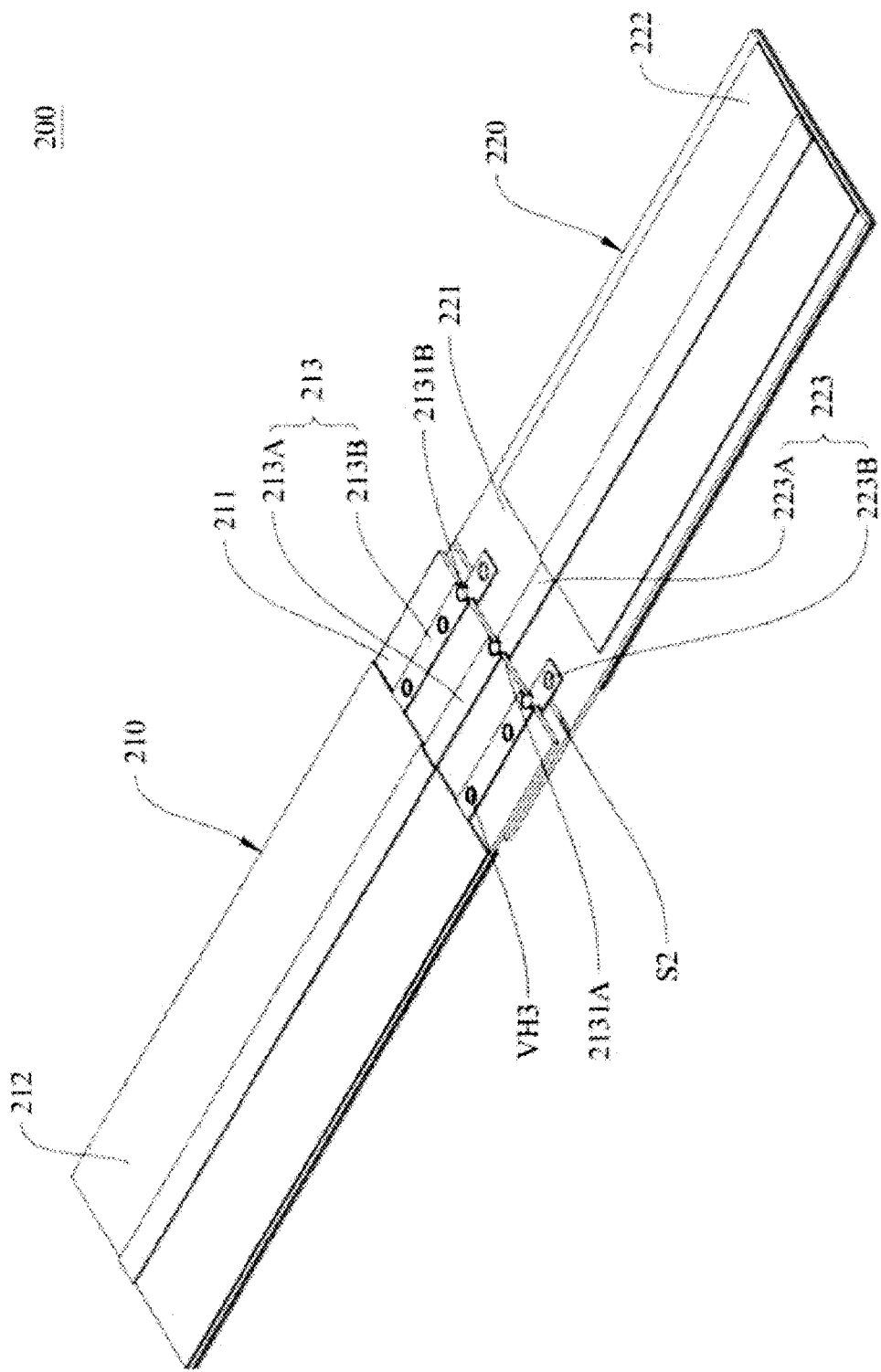
FIG. 7 is a perspective view of the second embodiment according to the present invention.
Figure 8:
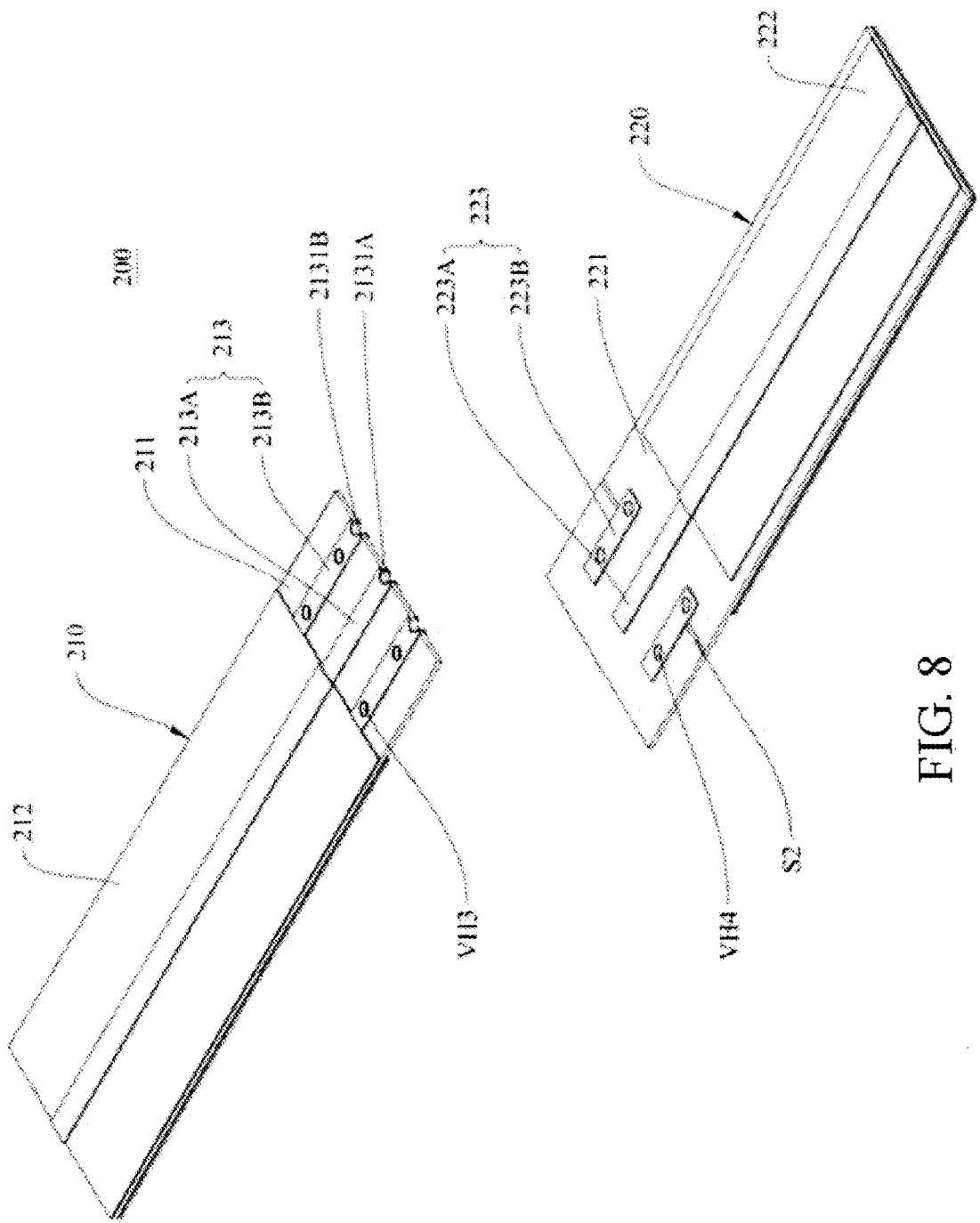
FIG. 8 is an exploded view (1) of the second embodiment according to the present invention.
Figure 9:
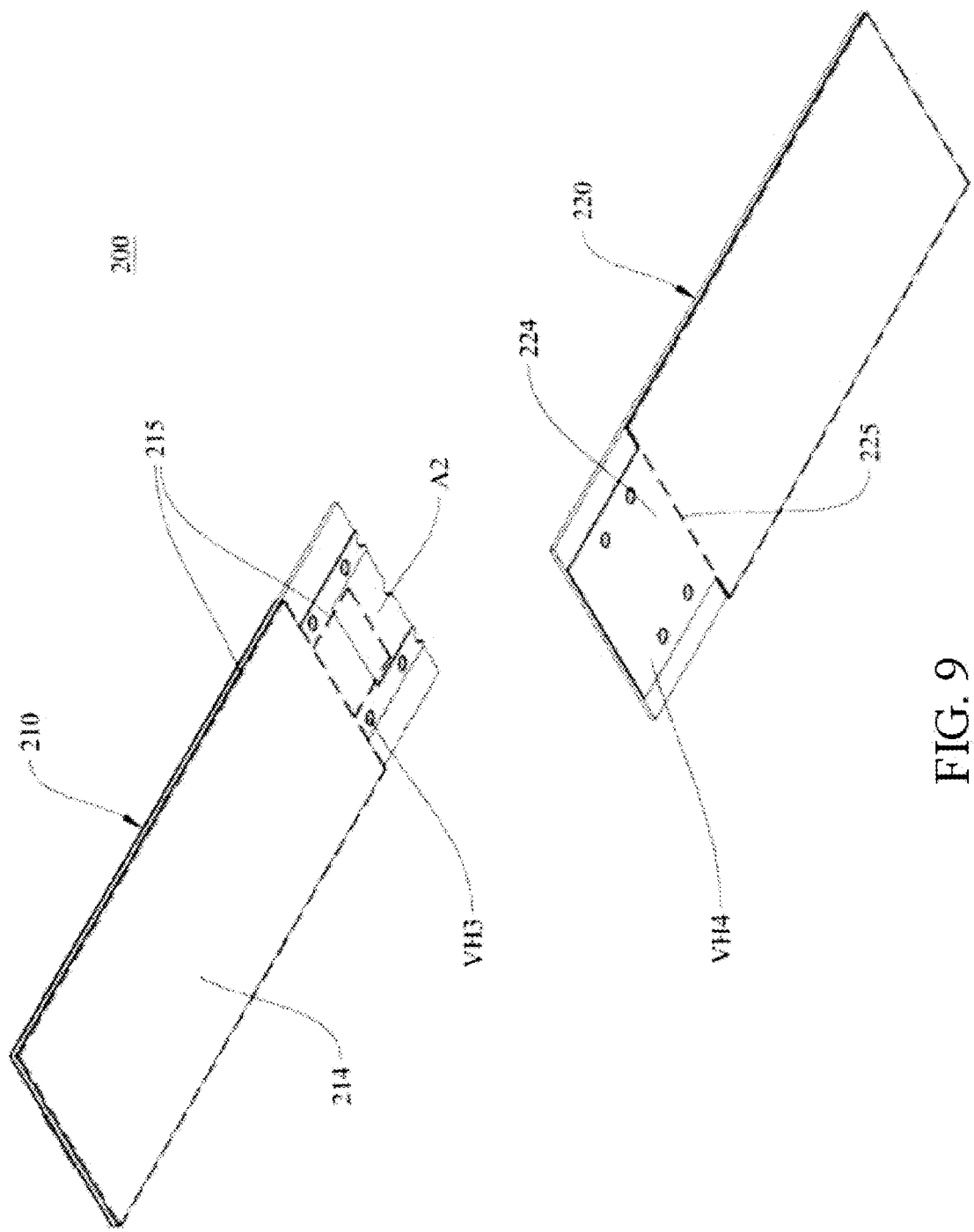
FIG. 9 is an exploded view (2) of the second embodiment according to the present invention.

FIG. 7, FIG. 8, and FIG. 9 are a perspective view, an exploded view (1), and an exploded view (2) of the second embodiment according to the present invention, respectively. The present invention is described below with reference to the aforesaid diagrams.

The second embodiment provides a flexible printed circuit and printed circuit board soldered structure 200 which comprises a flexible printed circuit 210 (FPC) and a printed circuit board 220 (PCB).

The flexible printed circuit 210 is tri-layered and comprises, from bottom to top, a protective layer 215, a soft board body 211, and a protective layer 212 disposed above the soft board body 211. A first signal pad region 213 is disposed on one side of the soft board body 211. A first grounding pad region 214 is disposed on the opposing side of the soft board body 211. Both the first signal pad region 213 and the first grounding pad region 214 are conductive copper foils disposed on the soft board body 211 by wiring layout. Therein, the first signal pad region comprises a first signal transmission line 213A and two first grounding soldering portions 213B which flank the first signal transmission line 213A.

High-frequency signals passing through a through hole are likely to produce parasitic capacitance and thus compromise signal integrity and high-frequency characteristics while high-frequency signal transmission is taking place; hence, the first signal transmission line 213A have an intact surface which dispenses with any through hole. Furthermore, the end of the first signal transmission line 213A is flush with the edge of the soft board body 211 so that the end of the first signal transmission line 213A can be soldered to a second signal transmission line 223A of the printed circuit board 220 below. In a preferred embodiment, a half hole 2131A for holding a solder FB (shown in FIG. 10) is disposed at the end of the first signal transmission line 213A so that the end of the first signal transmission line 213A can be covered with the solder FB and thus soldered to the second signal transmission line 223A of the printed circuit board 220 below.

Figure 10:
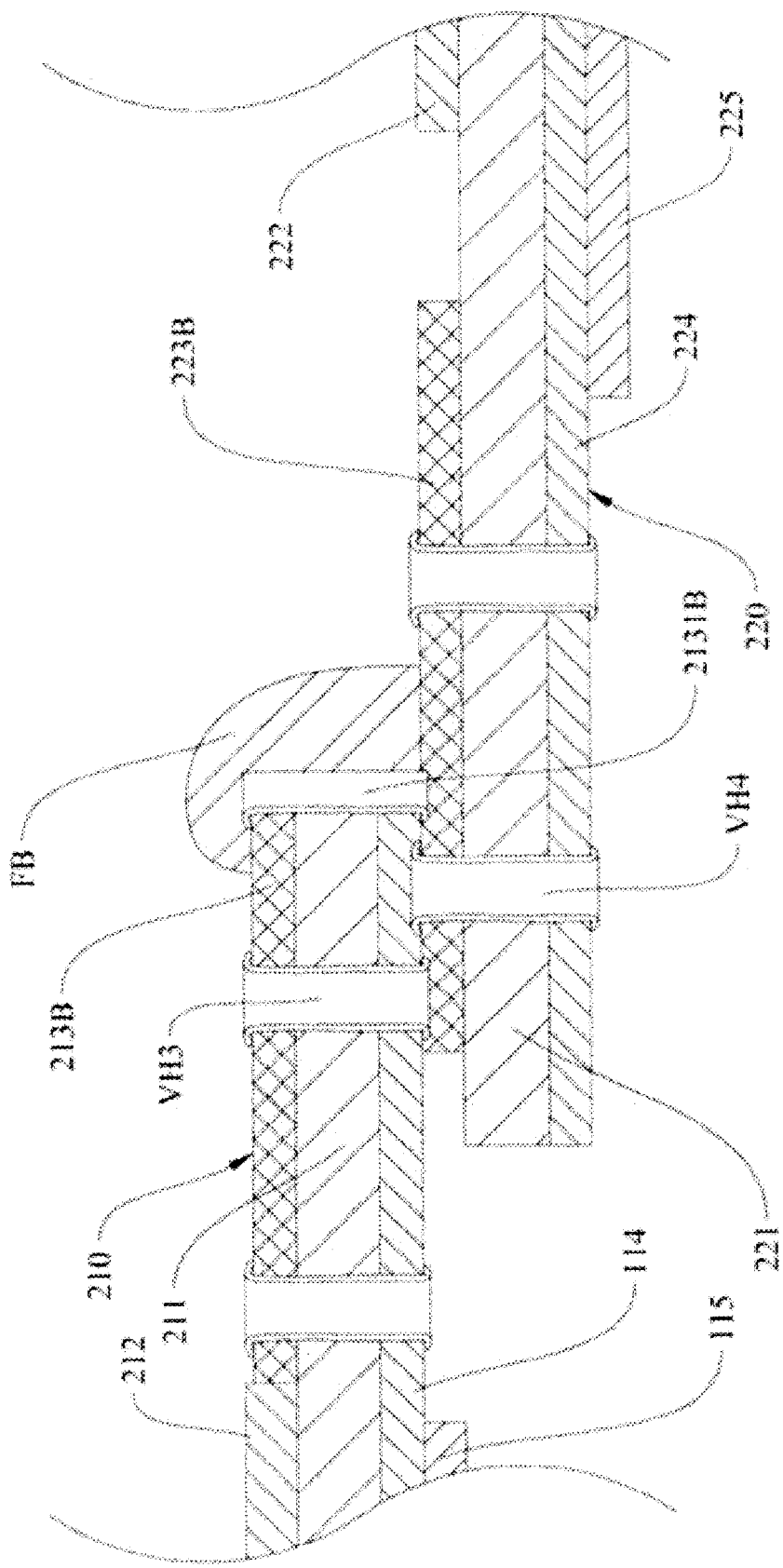
FIG. 10 is a cross-sectional view of the second embodiment according to the present invention.
Figure 11:
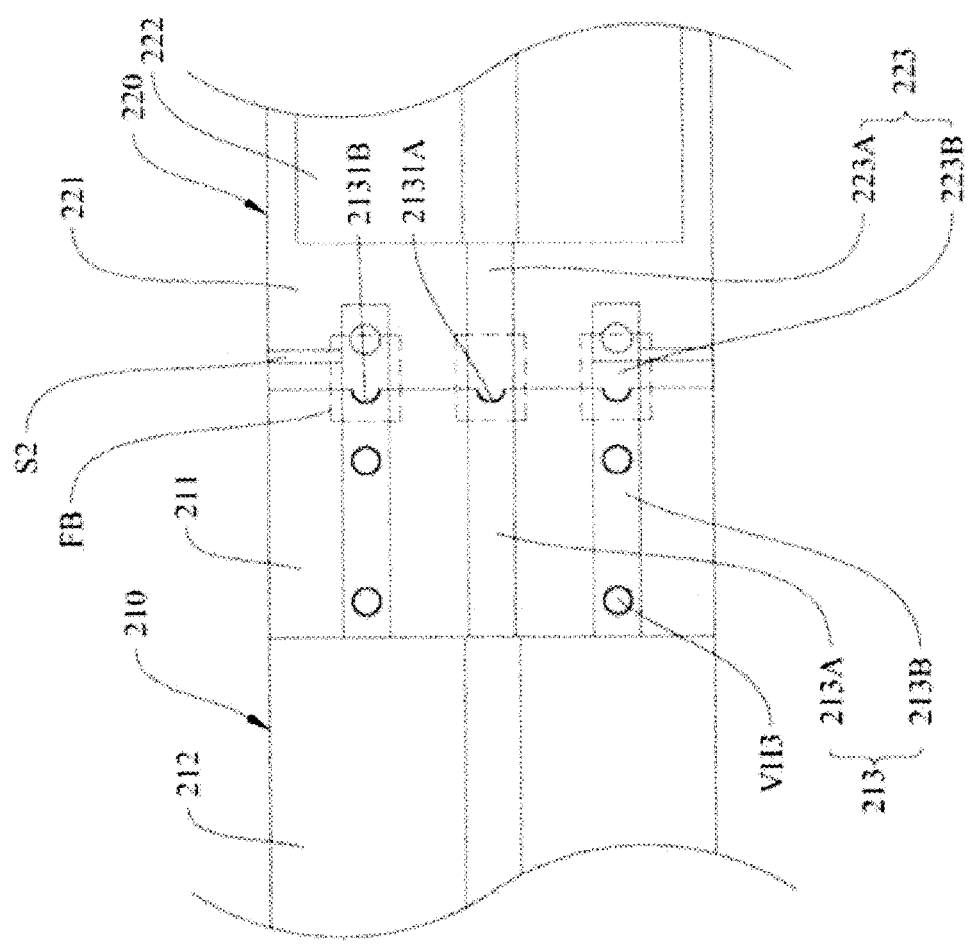
FIG. 11 is a top view of the second embodiment according to the present invention.

FIG. 10 and FIG. 11 are a cross-sectional view and a top view of the second embodiment according to the present invention, respectively. The present invention is described below with reference to the aforesaid diagrams.

A through hole VH3 is disposed on the first grounding soldering portion 213B to electrically connect the first grounding soldering portion 213B and the first grounding pad region 214. The edge of the first grounding soldering portion 213B and the edge of the soft board body 211 are flush with each other and thus can be soldered together from above the soft board body 211 and a second grounding soldering portion 223B of the printed circuit board 220 below. In a preferred embodiment, a half hole 2131B for holding the solder FB is disposed at the end of the first grounding soldering portion 213B so that the end of the first grounding soldering portion 213B can be covered with the solder FB and thus soldered to the second grounding soldering portion 223B of the printed circuit board 220 below. The through hole VH3 and the half hole 2131B are of any shapes, such as round and square, and the present invention is not limited thereto. The half hole 2131A, 2131B are optional. In another preferred embodiment, the half hole 2131A, 2131B are dispensed with, and the solder is attached to the surface of a metal film to effectuate electrical interconnects. In another preferred embodiment, the first grounding soldering portions 213B flank and extend along the first signal transmission line 213A and thus effectuate a grounded coplanar waveguide (GCPW) structure together with the first signal transmission line 213A, but the present invention is not limited thereto.

An insulating region A2 is disposed on the first grounding pad region 214 and corresponds in position to the first signal transmission line 213A on the soft board body 211. The insulating region A2 extends inward from an edge of the soft board body 211. Specifically, the insulating region A2 is disposed right below the first signal transmission line 213A so that the first grounding pad region 214 does not come into contact with the second signal transmission line 223A on the printed circuit board 220 when the flexible printed circuit 210 is disposed on the printed circuit board 220, so as not to develop any short circuit. The insulating region A2 is a naked region (i.e., the soft board body 211 per se), which dispenses with any copper foil, formed as a result of inward extension of the first grounding pad region 214. In another preferred embodiment, the insulating region A2 is an insulating layer disposed on the first grounding pad region 214, but the present invention is not limited thereto. In another preferred embodiment, the protective layer 215 below the soft board body 211 extends and covers the first grounding pad region 214 from below so that only metal pads with the through hole VH3 are exposed from two sides of the first grounding pad region 214 to prevent the first grounding pad region 214 from coming into contact with the end of the second signal transmission line 223A, so as not to develop any short circuit.

Referring to FIG. 7, FIG. 8, and FIG. 9, the printed circuit board 220 is tri-layered and comprises, from bottom to top, a protective layer 225, a substrate body 221, and a protective layer 222 disposed above the substrate body 221. A second signal pad region 223 is disposed on one side of the substrate body 221. A second grounding pad region 224 is disposed on the opposing side of the substrate body 221. Both the second signal pad region 223 and the second grounding pad region 224 are conductive copper foils disposed on the substrate body 221 by wiring layout. The second signal pad region 223 comprises a second signal transmission line 223A and two second grounding soldering portions 223B which flank the second signal transmission line 223A.

To prevent through holes from compromising high-frequency characteristics of high-frequency signals, the surface of the second signal transmission line 223A is intact and dispenses with any through hole to maintain the integrity of high-frequency signals being transmitted along the second signal transmission line 223A. The end of the printed circuit board 220 lacks the protective layer 222 so as to expose the second signal transmission line 223A and the second grounding soldering portions 223B for use in soldering.

Referring to FIG. 10, a through hole VH4 is disposed on the second grounding soldering portion 223B to electrically connect the second grounding soldering portion 223B and the second grounding pad region 224. In another preferred embodiment, the second grounding soldering portions 223B flank and extend along the second signal transmission line 223A and thus effectuate a grounded coplanar waveguide (GCPW) structure together with the second signal transmission line 223A, but the present invention is not limited thereto. The through hole VH2 is of any shapes, such as round and square, and the present invention is not limited thereto.

Figure 12:
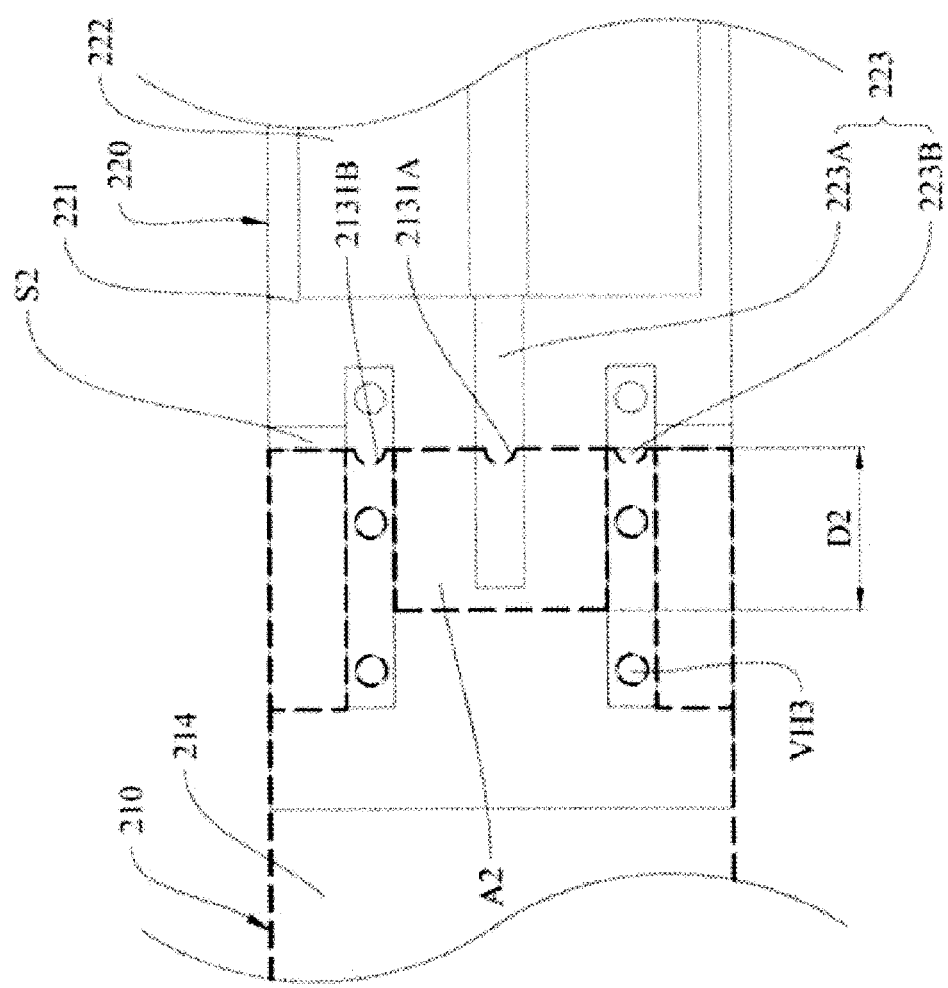
FIG. 12 is a partial transparent schematic view of the second embodiment according to the present invention.

FIG. 12 is a partial transparent schematic view of the second embodiment according to the present invention. The present invention is described below with reference to the aforesaid diagram.

The flexible printed circuit 210 is disposed on the printed circuit board 220. The insulating region A2 of the first grounding pad region 214 is disposed above the second signal transmission line 223A to stay away from the second signal transmission line 223A and thus preclude developing a short circuit together with the second signal transmission line 223A. The end of the first signal transmission line 213A is soldered to the second signal transmission line 223A by the solder FB to effectuate electrical connection.

To render it easy for assembly workers or automated machines to perform a soldering operation and reduce the likelihood soldering failures, a level sign S2 is disposed on the substrate body 221 of the printed circuit board 220 and beside the second signal transmission line 223A to serve as reference for use in the soldering operation. The level signs S2 enable the assembly workers or automated machines to confirm the distance between the insulating region A2 below the flexible printed circuit 210 and the end of the second signal transmission line 223A. The distance between level sign S2 and the end of the second signal transmission line 223A is preferably shorter than or equal to an extension distance D2 by which the insulating region A2 extends inward.

In conclusion, a flexible printed circuit and a printed circuit board soldered structure of the present invention not only displays satisfactory high-frequency transmission characteristics, but also enhances the integrity of high-frequency signals during signal transmission owing to dispensing with the need to provide any through hole at the positions of the soldering of signal transmission lines. Furthermore, the soldered structure of the present invention is so simple that it is almost the same as the soldering techniques disclosed in the prior art.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A flexible printed circuit and printed circuit board soldered structure, comprising:
   a flexible printed circuit comprising a soft board body, with a first signal pad region disposed on a side of the soft board body, and a first grounding pad region disposed on an opposing side of the soft board body, the first signal pad region comprising a pair of first differential signal transmission lines and two first grounding soldering portions flanking the pair of the first differential signal transmission lines, the first differential signal transmission lines having intact surfaces dispensing with any through hole, wherein ends of the first differential signal transmission lines are flush with an edge of the soft board body, with a through hole disposed on the first grounding soldering portion to electrically connect the first grounding soldering portion and the first grounding pad region, and an insulating region disposed on the first grounding pad region and corresponding in position to the first differential signal transmission lines on a side of the soft board body, the insulating region extending inward from an edge of the soft board body; and
   a printed circuit board comprising a substrate body, a second signal pad region disposed on a side of the substrate body, and a second grounding pad region disposed on an opposing side of the substrate body, the second signal pad region comprising a pair of second differential signal transmission lines and two second grounding soldering portions flanking the pair of second differential signal transmission lines, the second differential signal transmission lines having intact surfaces dispensing with any through hole, with a through hole disposed on the second grounding soldering portions to electrically connect the second grounding soldering portions and the second grounding pad region,
   wherein the flexible printed circuit is disposed on the printed circuit board, the insulating region of the first grounding pad region is disposed above the second differential signal transmission lines to stay away from the second differential signal transmission lines and thus preclude developing a short circuit together with the second differential signal transmission lines, and the ends of the first differential signal transmission lines are soldered to the second differential signal transmission lines from above by a solder to effectuate electrical connection.

2. The flexible printed circuit and printed circuit board soldered structure of claim 1, wherein a half hole is disposed at the ends of the first differential signal transmission lines to hold a solder.

3. The flexible printed circuit and printed circuit board soldered structure of claim 1, wherein an end of the first grounding soldering portion is flush with an edge of the soft board body, and the end of the first grounding soldering portion is soldered to the second grounding soldering portions from above by a solder to effectuate electrical connection.

4. The flexible printed circuit and printed circuit board soldered structure of claim 3, wherein a half hole is disposed at the end of the first grounding soldering portion to hold the solder.

5. The flexible printed circuit and printed circuit board soldered structure of claim 1, wherein a level sign is disposed on the substrate body of the printed circuit board and beside the second differential signal transmission lines to serve as soldering reference.

6. The flexible printed circuit and printed circuit board soldered structure of claim 5, wherein a distance between each said level sign and an end of a corresponding one of the second differential signal transmission lines is shorter than or equal to an extension distance by which the insulating region extends inward.

7. A flexible printed circuit and printed circuit board soldered structure, comprising:
   a flexible printed circuit comprising a soft board body, with a first signal pad region disposed on a side of the soft board body, and a first grounding pad region disposed on an opposing side of the soft board body, the first signal pad region comprising a first signal transmission line and two first grounding soldering portions flanking the first signal transmission line, the first signal transmission line having an intact surface dispensing with any through hole, wherein an end of the first signal transmission line is flush with an edge of the soft board body, with a through hole disposed on the first grounding soldering portion to electrically connect the first grounding soldering portion and the first grounding pad region, and an insulating region disposed on the first grounding pad region and corresponding in position to the first signal transmission line on a side of the soft board body, the insulating region extending inward from an edge of the soft board body; and
   a printed circuit board comprising a substrate body, a second signal pad region disposed on a side of the substrate body, and a second grounding pad region disposed on an opposing side of the substrate body, the second signal pad region comprising a second signal transmission line and two second grounding soldering portions flanking the second signal transmission line, the second signal transmission line having an intact surface dispensing with any through hole, with a through hole disposed on the second grounding soldering portions to electrically connect the second grounding soldering portions and the second grounding pad region,
   wherein the flexible printed circuit is disposed on the printed circuit board, the insulating region of the first grounding pad region is disposed above the second signal transmission line to stay away from the second signal transmission line and thus preclude developing a short circuit together with the second signal transmission line, and the end of the first signal transmission line is soldered to the second signal transmission line from above by a solder to effectuate electrical connection.

8. The flexible printed circuit and printed circuit board soldered structure of claim 7, wherein a half hole is disposed at the end of the first signal transmission line to hold a solder.

9. The flexible printed circuit and printed circuit board soldered structure of claim 7, wherein an end of the first grounding soldering portion is flush with an edge of the soft board body, and the end of the first grounding soldering portion is soldered to the second grounding soldering portions from above by a solder to effectuate electrical connection.

10. The flexible printed circuit and printed circuit board soldered structure of claim 9, wherein a half hole is disposed at the end of the first grounding soldering portion to hold the solder.

11. The flexible printed circuit and printed circuit board soldered structure of claim 7, wherein a level sign is disposed on the substrate body of the printed circuit board and beside the second signal transmission line to serve as soldering reference.

12. The flexible printed circuit and printed circuit board soldered structure of claim 11, wherein a distance between the level sign and an end of the second signal transmission line is shorter than or equal to an extension distance by which the insulating region extends inward.

\* \* \* \* \*